United States Patent
Hayashi

(10) Patent No.: US 9,960,063 B2
(45) Date of Patent: May 1, 2018

(54) SUBSTRATE TRANSPORT APPARATUS AND SUBSTRATE TRANSPORT METHOD

(71) Applicant: TOKYO ELECTRON LIMITED, Minato-ku (JP)

(72) Inventor: Tokutaro Hayashi, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 0 days. days.

(21) Appl. No.: 14/969,529

(22) Filed: Dec. 15, 2015

(65) Prior Publication Data
US 2016/0189390 A1 Jun. 30, 2016

(30) Foreign Application Priority Data
Dec. 24, 2014 (JP) .................. 2014-261085

(51) Int. Cl.
G06K 9/00 (2006.01)
H01L 21/67 (2006.01)
H01L 21/677 (2006.01)

(52) U.S. Cl.
CPC .. H01L 21/67259 (2013.01); H01L 21/67766 (2013.01); H01L 21/67781 (2013.01)

(58) Field of Classification Search
CPC .... G06T 7/60; G06T 7/20; G06T 7/13; G06T 7/70; G06T 2207/30148; H01L 21/67259; H01L 21/67766; H01L 21/67781
See application file for complete search history.

(56) References Cited

U.S. PATENT DOCUMENTS

| 6,198,976 B1 * | 3/2001 | Sundar .................. H01L 21/681 700/121 |
| 7,751,992 B2 * | 7/2010 | Duarte ................ H02M 5/2573 702/57 |
| 8,781,787 B2 | 7/2014 | Hayashi et al. |
| 9,507,349 B2 * | 11/2016 | Hayashi ............ H01L 21/67259 |
| 2012/0046904 A1 * | 2/2012 | Hayashi ................ H01L 21/681 702/150 |

(Continued)

FOREIGN PATENT DOCUMENTS

| JP | 08-274143 | * 10/1996 | ............. H01L 21/68 |
| JP | 08-274143 A | 10/1996 | |

(Continued)

Primary Examiner — Amara Abdi
(74) Attorney, Agent, or Firm — Oblon, McClelland, Maier & Neustadt, L.L.P.

(57) ABSTRACT

An apparatus for transporting a substrate includes a base, a holding device which retracts relative to the base and holds multiple substrates in multiple stages, respectively, a detection device including three detection components such that the three detection components are positioned to detect peripheries of the substrates held by the holding device from different positions, respectively, and a control device including circuitry which estimates a position of the substrates based on detection result of the detection device, calculates an amount of shifting between a base position and an estimated position of the substrates, determines whether a calculated amount of shifting is within a threshold value, and executes transport of the substrates held by the holding device when the calculated amount of shifting is determined to be within the threshold value.

20 Claims, 12 Drawing Sheets

(56) References Cited

U.S. PATENT DOCUMENTS

| | | | | |
|---|---|---|---|---|
| 2013/0202388 A1* | 8/2013 | Hayashi | ............... | H01L 21/677 |
| | | | | 414/222.02 |
| 2013/0204421 A1* | 8/2013 | Hayashi | ............ | H01L 21/67259 |
| | | | | 700/112 |
| 2013/0211571 A1* | 8/2013 | Teramoto | ........... | G05B 19/4189 |
| | | | | 700/112 |
| 2014/0277690 A1* | 9/2014 | Yoshida | ............ | H01L 21/67781 |
| | | | | 700/214 |

FOREIGN PATENT DOCUMENTS

| JP | 10-340940 | * | 6/1997 | ............ | H01L 21/68 |
|---|---|---|---|---|---|
| JP | 10-340940 A | | 12/1998 | | |
| JP | 2013-165119 | * | 2/2012 | ............ | H01L 21/68 |
| JP | 2013-165119 A | | 8/2013 | | |

* cited by examiner

SUBSTRATE TRANSPORT APPARATUS AND SUBSTRATE TRANSPORT METHOD

CROSS-REFERENCE TO RELATED APPLICATIONS

The present application is based upon and claims the benefit of priority to Japanese Patent Application No. 2014-261085, filed Dec. 24, 2014, the entire contents of which are incorporated herein by reference.

BACKGROUND OF THE INVENTION

Field of the Invention

The present invention relates to a substrate transport apparatus and a substrate transport method.

Description of Background Art

JP H8-274143A describes a substrate transport apparatus, which has a photoelectric sensor attached to the tip of a fork and determines whether or not the position of a substrate has shifted based on detection results of the photoelectric sensor. The entire contents of this application are incorporated herein by reference.

SUMMARY OF THE INVENTION

According to one aspect of the present invention, an apparatus for transporting a substrate includes a base, a holding device which retracts relative to the base and holds multiple substrates in multiple stages, respectively, a detection device including three detection components such that the three detection components are positioned to detect peripheries of the substrates held by the holding device from different positions, respectively, and a control device including circuitry which estimates a position of the substrates based on detection result of the detection device, calculates an amount of shifting between a base position and an estimated position of the substrates, determines whether a calculated amount of shifting is within a threshold value, and executes transport of the substrates held by the holding device when the calculated amount of shifting is determined to be within the threshold value.

According to another aspect of the present invention, a substrate processing system includes a substrate transport apparatus including a base, a holding device which retracts relative to the base and holds multiple substrates in multiple stages, respectively, a detection device including three detection components such that the three detection components are positioned to detect peripheries of the substrates held by the holding device from different positions, respectively, and a control device including circuitry which estimates a position of the substrates based on detection result of the detection device, calculates an amount of shifting between a base position and an estimated position of the substrates, determines whether a calculated amount of shifting is within a threshold value, and executes transport of the substrates held by the holding device when the calculated amount of shifting is determined to be within the threshold value.

According to yet another aspect of the present invention, a method for transporting a substrate includes holding multiple substrates such that a holding device which retracts relative to the base holds the substrates in multiple stages, respectively, detecting peripheries of the substrates held by the holding device such that a detection device including three detection components detects the peripheries of the substrates from different positions, respectively, estimating a position of the substrates based on detection result of the detection device, calculating an amount of shifting between a base position and an estimated position of the substrates, determining whether a calculated amount of shifting is within a threshold value, and executing transport of the substrates held by the holding device when the calculated amount of shifting is determined to be within the threshold value.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE EMBODIMENTS

Figure 1:
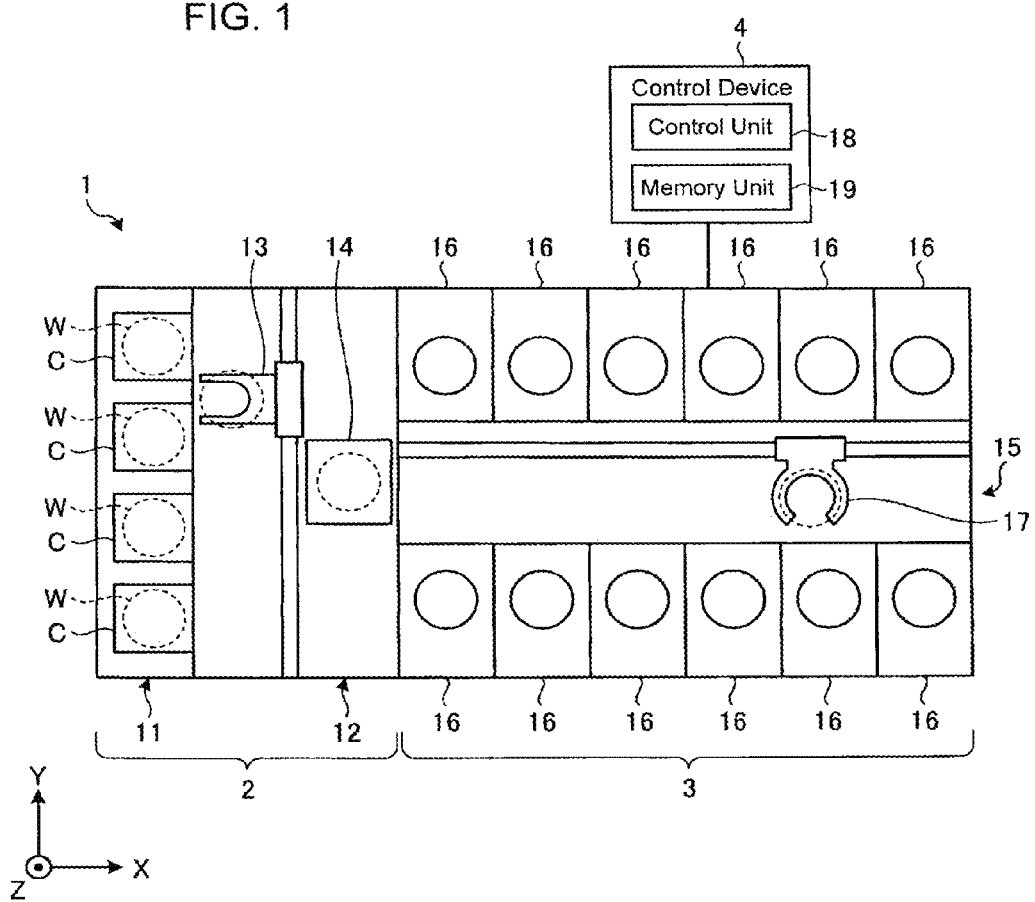
FIG. 1 is a view schematically showing the structure of a substrate processing system according to an embodiment of the present invention.

The embodiments will now be described with reference to the accompanying drawings, wherein like reference numerals designate corresponding or identical elements throughout the various drawings.

FIG. 1 is a view schematically showing the structure of a substrate processing system according to an embodiment of the present invention. In the following, X, Y and Z axes intersecting each other at right angles are specified to clarify positional relationships, and a positive direction of the Z axis is set as the vertically upward direction.

As shown in FIG. 1, substrate processing system 1 is provided with loading station 2 and processing station 3. Loading station 2 and processing station 3 are positioned to be adjacent to each other.

Loading station 2 includes carrier mounting zone 11 and transport zone 12. Multiple carriers (C), which horizontally accommodate multiple substrates—semiconductor wafers (hereinafter wafers (W)) in the present embodiment—are mounted in carrier mounting zone 11.

Transport zone 12 is positioned adjacent to carrier mounting zone 11, and is provided with substrate transport apparatus 13 and delivery table 14. Substrate transport apparatus 13 has a wafer holding mechanism for holding a wafer (W). Substrate transport apparatus 13 is capable of moving horizontally and vertically as well as rotating around the vertical axis, and transports a wafer (W) between a carrier (C) and delivery table 14 using the wafer holding mechanism.

Processing station 3 is positioned adjacent to transport zone 12. Processing station 3 includes transport zone 15 and multiple processing units 16. Multiple processing units 16 are aligned on each side of transport zone 15.

Substrate transport device 17 is provided in transport zone 15. Substrate transport device 17 includes a wafer holding mechanism for holding a wafer (W). In addition, substrate transport device 17 is capable of moving horizontally and vertically as well as rotating around the vertical axis, and transports a wafer (W) between delivery table 14 and processing unit 16 using the wafer holding mechanism.

Processing unit 16 conducts predetermined treatments on a wafer (W) transported by substrate transport device 17.

Substrate processing system 1 includes control device 4. Control device 4 is a computer, for example, and includes control unit 18 and memory unit 19. Memory unit 19 stores a program for controlling various treatments carried out in substrate processing system 1. Control unit 18 controls operations to be performed in substrate processing system 1 by reading out and executing the program stored in memory unit 19.

Such a program may be stored in a computer-readable medium and installed from the memory medium onto memory unit 19 of control device 4. Examples of a computer-readable medium are hard disks (HD), flexible disks (FD), compact discs (CD), magneto-optical discs (MO), memory cards and the like.

In substrate processing system 1 structured as above, first, substrate transport apparatus 13 of loading station 2 takes out a wafer (W) from carrier (C) in carrier mounting zone 11, and loads the wafer (W) on delivery table 14. The wafer (W) loaded on delivery table 14 is unloaded by substrate transport device 17 of processing station 3 to be loaded into processing unit 16.

The wafer (W) loaded into processing unit 16 is treated in processing unit 16 and is unloaded from processing unit 16 by substrate transfer device 17 to be loaded onto delivery table 14. Then, the treated wafer (W) loaded on delivery table 14 is returned by substrate transport apparatus 13 to carrier (C) in carrier mounting zone 11.

Structure of Processing Unit

Figure 2:
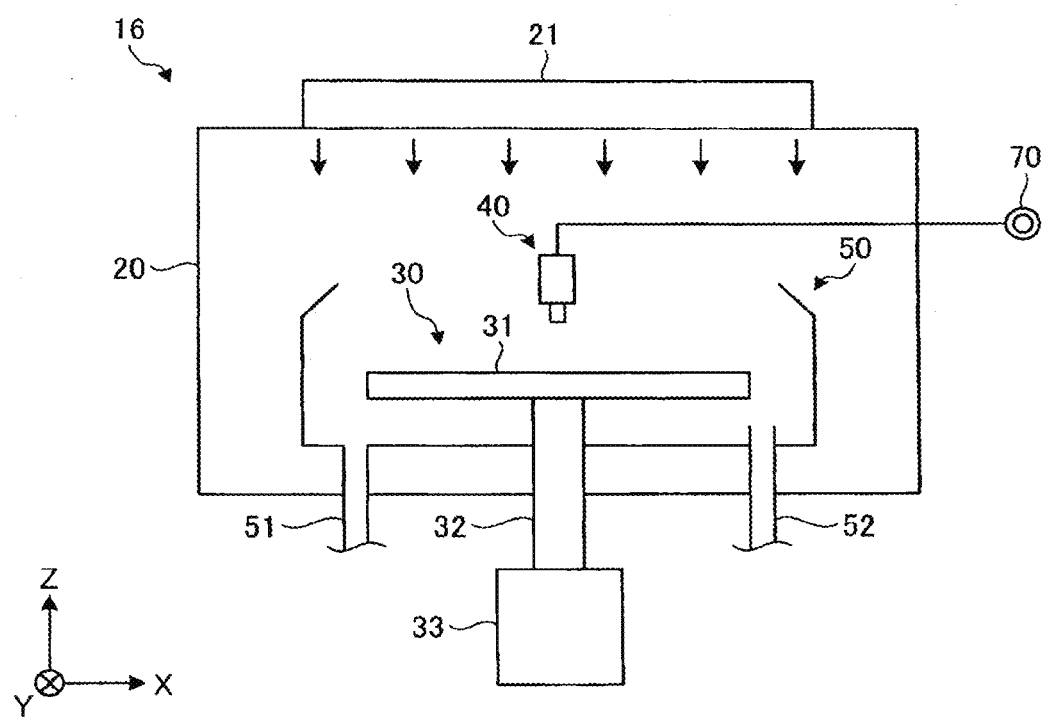
FIG. 2 is a view schematically showing the structure of a processing unit.

The structure of processing unit 16 is described with reference to FIG. 2. FIG. 2 is a view schematically showing the structure of processing unit 16.

As shown in FIG. 2, processing unit 16 is provided with chamber 20, substrate holding mechanism 30, processing liquid supply device 40 and collection cup 50.

Chamber 20 accommodates substrate holding mechanism 30, processing liquid supply device 40 and collection cup 50. Fan filter unit (FFU) 21 is installed on the ceiling of chamber 20. FFU 21 generates a downflow in chamber 20.

Substrate holding mechanism 30 is provided with holding device 31, support post 32, and driver device 33. Holding device 31 holds wafers (W) horizontally. Support post 32 is a component extending vertically with its base portion supported by driver device 33 so as to be rotatable, and horizontally supports holding device 31 at its top portion. Driver device 33 rotates support post 32 around the vertical axis. Substrate holding mechanism 30 structured as above rotates support post 32 using driver device 33 to rotate holding device 31 supported by support post 32. Accordingly, the wafer (W) held by holding device 31 is rotated.

Processing-liquid supply device 40 supplies a processing liquid to a wafer (W). Processing-liquid supply device 40 is connected to processing-liquid supply source 70.

Collection cup 50 is positioned to surround holding device 31, and collects the processing liquid scattered from a wafer (W) as holding device 31 rotates. Drain port 51 is formed at the bottom of collection cup 50, and the processing liquid collected in collection cup 50 is drained from drain port 51 to the outside of processing unit 16. In addition, exhaust port 52 is formed at the bottom of collection cup 50 so that the gas supplied from FFU 21 is exhausted to the outside of processing unit 16.

Structure of Substrate Transport Apparatus

Figure 3:
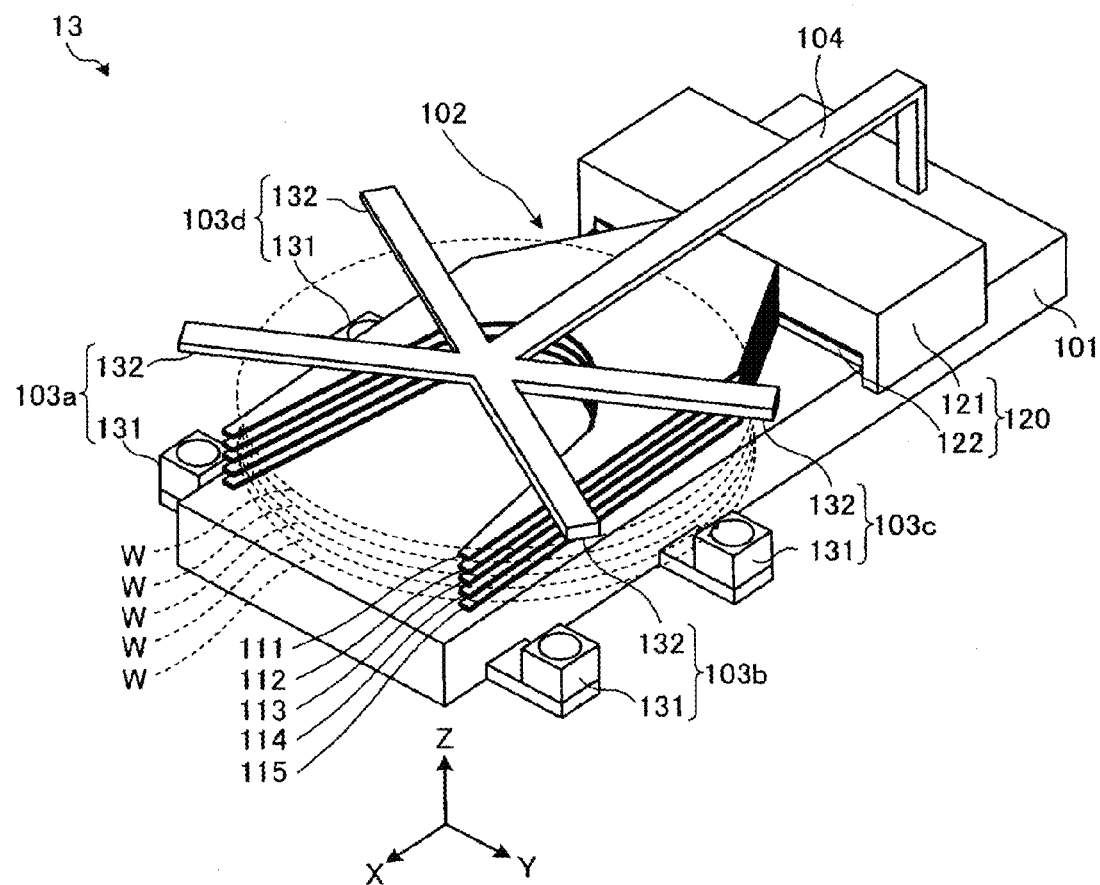
FIG. 3 is a perspective view of a substrate transport apparatus according to the embodiment.

The structure of substrate transport apparatus 13 according to an embodiment of the present invention is described with reference to FIG. 3. FIG. 3 is a view showing the structure of substrate transport apparatus 13 of the present embodiment.

As shown in FIG. 3, substrate transport apparatus 13 of the present embodiment is formed with base 101, holding device 102, multiple (four, in the example) detection components (103a~103d), and support component 104.

Base 101 is capable of moving along the Y-axis and rotating around the Z-axis. Holding device 102, detection components (103a~103d) and support component 104 are provided on base 101.

Holding device 102 is capable of holding multiple wafers (W) in multiple stages. More specifically, holding device 102 is provided with multiple (five, in the example) forks (111~115), and moving mechanism 120 which advances/retracts forks (111~115) relative to base 101.

Forks (111~115) are set to be multiple stages in the Z direction. Forks (111~115) are positioned in that order from top to bottom. Forks (111~115) are each formed in a bifurcated shape having a width smaller than the diameter of wafers (W).

Moving mechanism 120 includes first moving mechanism 121 that advances/retracts forks (111~114) all at once, and second moving mechanism 122 that advances/retracts fork 115. Namely, moving mechanism 120 is capable of advancing/retracting fork 115 among multiple forks (111~115) separately from other forks (111~114).

Detection components (103a~103d) respectively detect different spots on the peripheries of wafers (W) held by holding device 102. Detection components (103a~103d) are each structured to have light projecting component 131 and light receiving component 132.

Light projecting component 131 and light receiving component 132 are set to vertically sandwich wafers (W) held by holding device 102 when holding device 102 is in a retracted position (home position). Light projecting component 131 is set below holding device 102 and is attached to base 101. Light receiving component 132 is set above holding device 102 and is attached to later-described support component 104, which is installed on base 101.

Positioning light projecting component 131 and light receiving component 132 is not limited to the above. For example, light projecting component 131 may be set above holding device 102 while light receiving component 132 is set below holding device 102. In addition, if detection components (103a~103d) are reflective optical sensors, light projecting component 131 and light receiving component 132 may both be set above or below holding device 102.

Support component 104 supports light receiving components 132 from above. The shape of support component 104 is not limited specifically.

Structure of Detection Device

Figure 4:
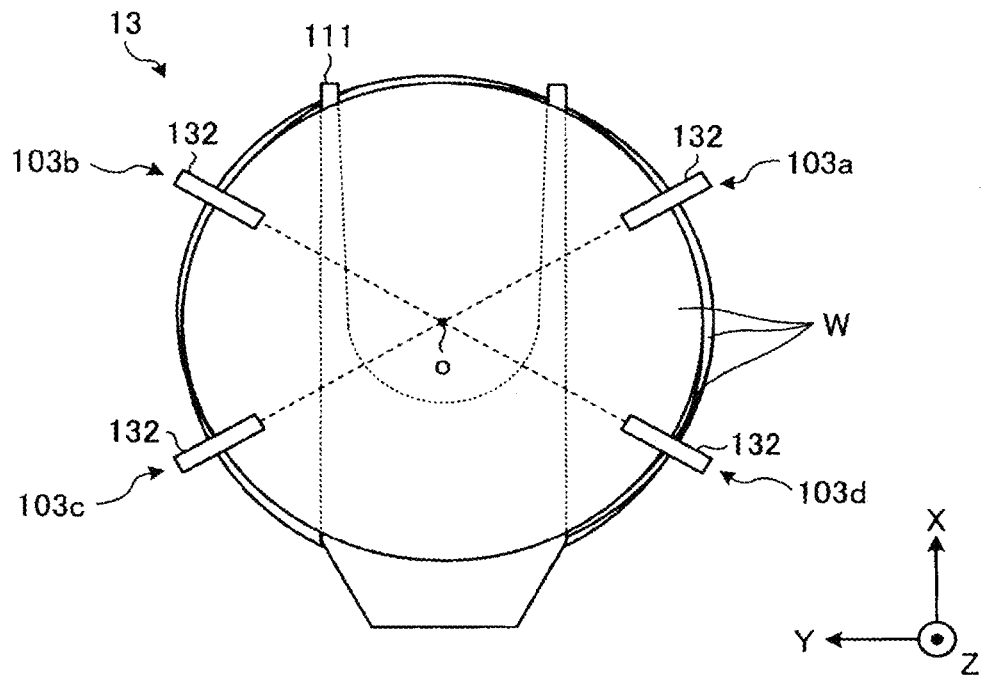
FIG. 4 is a plan view of the substrate transport apparatus according to the embodiment.
Figure 5:
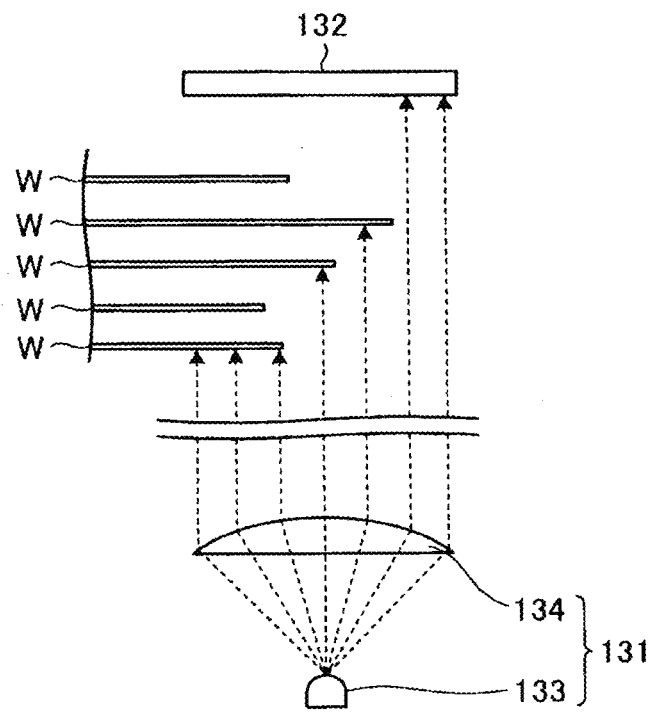
FIG. 5 is a side view schematically showing a light projecting component and light receiving component.

The structure of detection components (103a~103d) is described with reference to FIGS. 4 and 5. FIG. 4 is a plan view of substrate transport apparatus 13 according to the present embodiment. FIG. 5 is a side view schematically showing light projecting component 131 and light receiving component 132.

Light receiving component 132 is a group of sensors where multiple light-receiving elements are arrayed in a straight line. A linear image sensor, for example, may be used for light receiving component 132. In the present embodiment, light receiving component 132 is set as a linear image sensor and is described accordingly as such.

As shown in FIG. 4, each light receiving component 132 is positioned so that a virtual straight line extending in the alignment direction of light receiving elements passes through predetermined base position (o). Light receiving component 132 of detection component (103a) is positioned opposite light receiving component 132 of detection component (103c) with base position (o) set in between; and light receiving component 132 of detection component (103b) is positioned opposite light receiving component 132 of detection component (103d) with base position (o) set in between.

Base position (o) is a position that allows normal delivery of a wafer (W) and indicates the center position of a wafer (W) (namely, a virtual center position of a wafer (W)) when the wafer (W) is loaded in a normal position of holding device 102.

As shown in FIG. 5, light projecting component 131 is formed with light source 133 and lens 134. Light source 133 emits diffused light. Lens 134 is positioned above light source 133 and refracts diffused light emitted from light source 133 so that parallel light is irradiated toward its paired light receiving component 132.

The parallel light irradiated from light projecting component 131 toward light receiving component 132 is blocked partially by wafers (W) held by holding device 102. Accordingly, in light receiving component 132, the amount of light at a light receiving element that has received the parallel light from light projecting component 131 is different from the amount of light at a light receiving element that has not received such light. Detection components (103a~103d) detect the peripheries of wafers (W) based on differences in the amount of light. Detection components (103a~103d) output detection results to control device 18.

It is possible multiple wafers (W) held by holding device 102 are each shifted in a different direction. Thus, detection components (103a~103d) may detect the periphery of the same wafer (W) or may detect peripheries of different wafers (W). However, it is difficult to determine whether detection components (103a~103d) have detected the periphery of the same wafer (W) or detected peripheries of different wafers (W) respectively. Accordingly, substrate transport apparatus 13 of the present embodiment performs positional-shifting determination described below so as to accurately determine whether or not wafers (W) are shifted.

Positional-Shifting Determination

Figure 6:
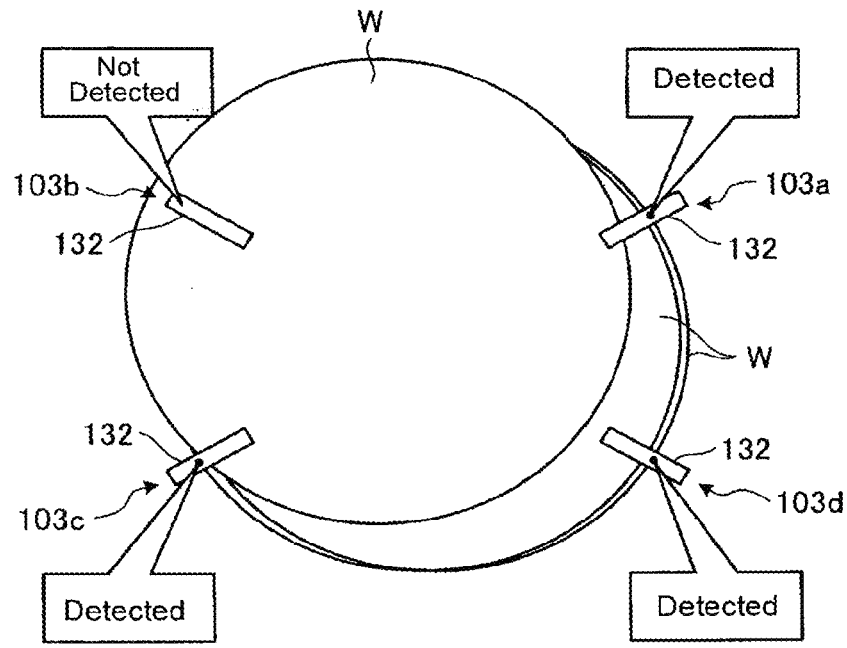
FIG. 6 is a view illustrating a first determination process.

Positional-shifting determination in the present embodiment is performed in three stages—a "first determination process," a "second determination process" and a "third determination process." The "first determination process" is described with reference to FIG. 6. FIG. 6 is a view illustrating the first determination process.

Positional-shifting determination is performed according to controls by control device 18. Control device 18 is a central processing unit (CPU), for example; "first determination process," "second determination process" and "third determination process" are carried out when control device 18 reads out and executes the program (not shown) stored in memory unit 19. Control device 18 may also be structured to have only hardware without applying programs.

In the following, detection component (103a) may also be referred to as "first detection component (103a)," detection component (103b) as "second detection component (103b)," detection component (103c) as "third detection component (103c)," and detection component (103d) as "fourth detection component (103d)."

First Determination Process

In the first determination process, control device 18 checks all detection components (103a~103d) and determines whether or not the peripheries of all the wafers (W) held by holding device 102 are positioned within a detection range.

For example, when a wafer (W) is shifted significantly toward second detection component (103b) as shown in FIG. 6, parallel light irradiated from light projecting component 131 of second detection component (103b) is entirely blocked by the wafer (W). In such a case, second detection component (103b) does not detect the periphery of the wafer (W). Also, when all wafers (W) are shifted significantly toward fourth detection component (103d), parallel light irradiated from light projecting component 131 of second detection component (103b) is not blocked at all and reaches light receiving component 132. In such a case as well, second detection component (103b) does not detect any periphery of wafers (W).

When the periphery of a wafer (W) is not detected within the detection range of any of first through fourth detection components (103a~103d), control device 18 determines that positional shifting has occurred in any of wafers (W) held by holding device 102. On the other hand, when detection components (103a~103d) each have detected the periphery of a wafer (W) in the first determination process, control device 18 determines that peripheries of all the wafers (W) are positioned within the detection range, and proceeds to the second determination process described below.

Second Determination Process

Figure 7:
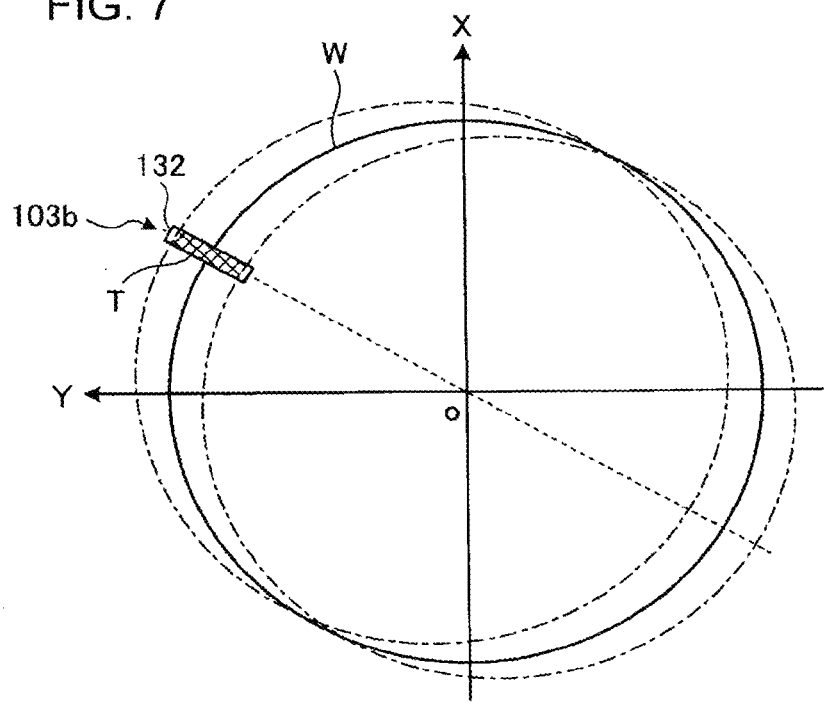
FIG. 7 is a view illustrating a second determination process.

A second determination process is described with reference to FIG. 7. FIG. 7 is a view illustrating the second determination process.

In the second determination process, control device 18 determines whether or not the periphery of a wafer (W) detected in each of detection components (103a~103d) is positioned within a predetermined area in the detection range of detection components (103a~103d) (hereinafter referred to as "the first threshold range").

As shown in FIG. 7, first threshold range (T) is set by a detected position on the periphery of a wafer (W) when the wafer (W) is assumed to have shifted along the alignment direction of light receiving elements in light receiving component 132 beyond a predetermined allowable amount of shifting.

When the periphery of a wafer (W) is detected at one spot, the shifted amount of the wafer (W) from base position (o) shows the minimum value if the wafer (W) is assumed to have shifted along the alignment direction of the light receiving elements in light receiving component 132. Thus, by determining whether the periphery of a wafer (W) detected by detection components (103a~103d) is positioned within first threshold range (T), the shifted amount of the wafer (W) can be confirmed not to be beyond the allowable area in the detection range of detection components (103a~103d).

When control device 18 determines that the peripheries of wafers (W) detected in all detection components (103a~103d) are positioned within first threshold range (T), control device 18 proceeds to the third determination process.

Third Determination Process

Figure 8:
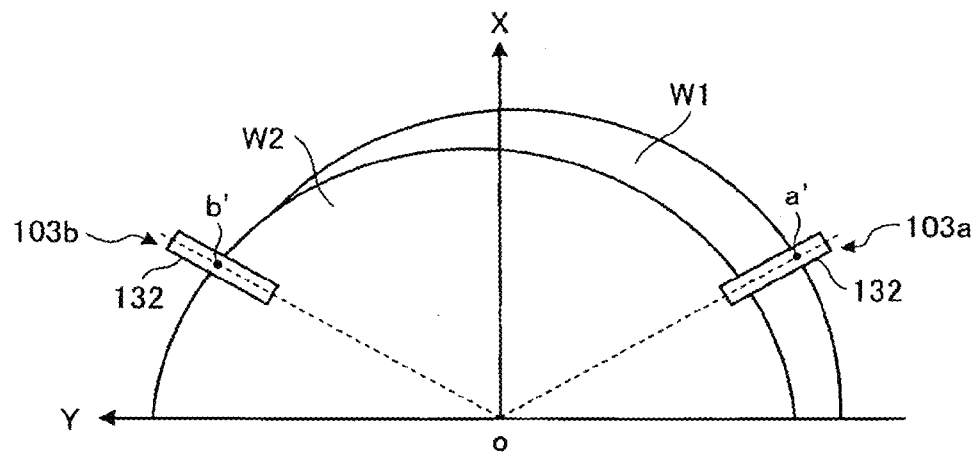
FIG. 8 is a view illustrating a third determination process.
Figure 9:
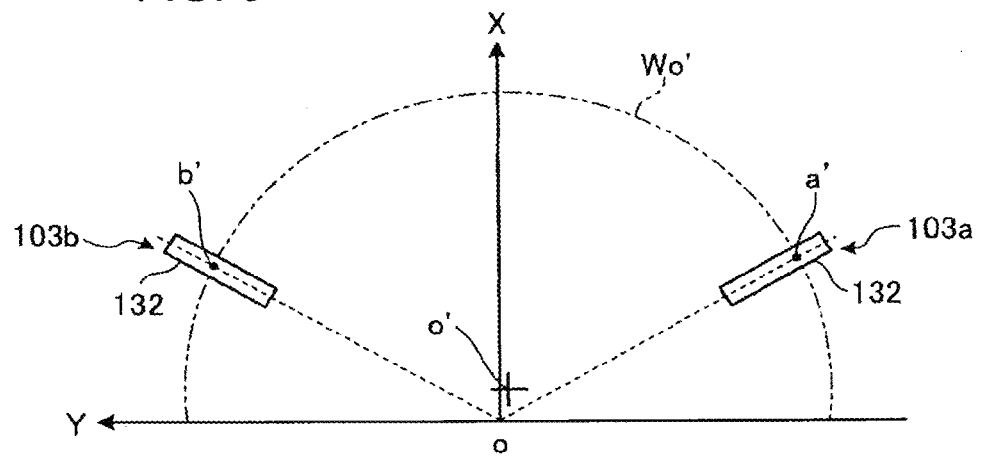
FIG. 9 is a view illustrating the third determination process.
Figure 10:
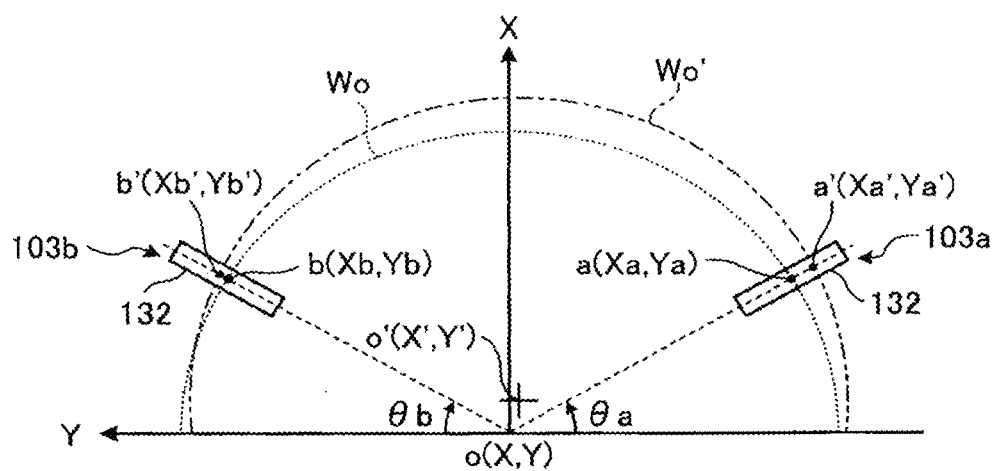
FIG. 10 is a view illustrating the third determination process.

A third determination process is described with reference to FIG. 8~10. FIG. 8~10 are views illustrating the third determination process.

In the third determination process, control device 18 estimates the position (center position) of a wafer (W) based on the detection results of detection components (103a~103d), calculates the shifted amount from the estimated position of the wafer (W) and base position (o), and then determines whether the calculated amount of shifting is within a threshold value (hereinafter referred to as the "second threshold value").

For example, as shown in FIG. 8, when the periphery of wafer (W1) is detected by first detection component (103a) and the periphery of wafer (W2) is detected by second detection component (103b) adjacent to first detection component (103a), the detected spot by first detection component (103a) is set as spot (a') and the detected spot by second detection component (103b) as spot (b').

In such a case, control device 18 assumes that first and second detection components (103a, 103b) have detected the periphery of the same wafer (Wo'), and calculates center position (o') of wafer (Wo') from spots (a', b'). Here, detected spots (a', b') may be on the periphery of the same wafer (W) or may be on peripheries of different wafers (W) loaded in multiple stages. Thus, control device 18 calculates center position (o') of wafer (Wo') from spots (a', b') by assuming that first and second detection components (103a, 103b) have detected the periphery of the same wafer (Wo').

More specifically, as shown in FIG. 10, when a wafer (Wo) is not shifted, namely, its center position corresponds to base position (o), the detected spot by first detected device (103a) is set as spot (a), and the detected spot by second detected device (103b) is set as spot (b). Then, distance (Δa) between spots (a, a') and distance (Δb) between spots (b, b') are as follows: Δa={(number of pixels at spot (a'))−(number of pixels at spot (a))}×resolution of detection component (103a); and Δb={(number of pixels at spot (b'))−(number of pixels at spot (b))}×resolution of detection component (103b). Here, in light receiving component 132 as a linear image sensor, the number of pixels at spot (a) indicates the number of pixels measured from the edge of first detection component (103a) on the center side of a wafer (W) to spot (a).

When the coordinates of base position (o) is set as X and Y, the radius of a wafer (W) as R, and angles made by the Y-axis and the extensions of first and second detection components (103a, 103b) respectively as θa and θb, then coordinates of spots (a, b, a', b') are as follows:

spot($a$)($Xa,Ya$)=($X+R\sin(\theta a), Y-R\cos(\theta a)$);

spot($b$)($Xb,Yb$)=($X+R\sin(\theta b), Y+R\cos(\theta b)$);

spot($a'$)($Xa',Ya'$)={$X+(R+\Delta a)\sin(\theta a), Y-(R+\Delta a)\cos(\theta a)$}; and spot($b'$)($Xb',Yb'$)={$X+(R+\Delta b)\sin(\theta b), Y+(R+\Delta b)\cos(\theta b)$}.

Since radius (R) of wafer (Wo') is known, coordinates (X', Y') of center position (o') of wafer (Wo') is calculated from radius (R) and coordinates of spots (a', b'). Namely, the center of a circle that passes through spots (a', b') is positioned on the perpendicular bisector of a line connecting spots (a', b'), and the distance from spot (a' or b') to center position (o') of wafer (Wo') corresponds to radius (R). Thus, the coordinate of the point where the above perpendicular bisector intersects a circle centered at spot (a' or b') with radius (R) corresponds to the coordinate (X', Y') of center position (o') of wafer (Wo'). Here, there are two intersecting points when the above perpendicular bisector intersects a circle centered at spot (a' or b') with radius (R). The coordinate (X', Y') of center position (o') indicates the one closer to base position (o).

Next, control device 18 calculates the distance between coordinate (X', Y') of center position (o') of wafer (Wo') and coordinate (X, Y) of base position (o) as the shifted amount of center position (o') of wafer (Wo') from base position (o).

Also, control device 18 performs the above process of calculating a shifted amount using other combinations of detection components (103a~103d). Namely, control device 18 performs the same process to calculate the shifted amount detected by second and third detection components (103b, 103c), by third and fourth detection components (103c, 103d), and by fourth and first detection components (103d, 103a).

Then, control device 18 determines whether or not the maximum amount of shifting, that is the maximum value among the shifted amounts calculated above, is within a predetermined second threshold value. When the maximum amount of shifting exceeds the second threshold value, control device 18 determines that positional shifting has occurred in any of the multiple wafers (W) held by holding device 102.

If the shifted amount is calculated by assuming that the periphery of a wafer (Wo') is detected by any two adjacent detection components among detection components (103a~103d), the value is greater than that obtained when the two adjacent detection components among detection components (103a~103d) each detect the periphery of a different wafer (W) separately. Substrate transport apparatus 13 of the present embodiment has focused on such a value difference and has employed the method as follows: each time a combination of two adjacent detection components among detection components (103a~103d) performs a detection process, the shifted amount from base position (o) is calculated by assuming that the periphery of the same wafer (Wo') is detected; and the maximum value of the obtained amounts of shifting is estimated to be the maximum amount of shifting from base position (o) of multiple wafers (W) held by holding device 102. By so calculating, if the maximum amount of shifting exceeds the second threshold value, it is found that one of the multiple wafers (W) is shifted beyond the second threshold value. In other words, if the maximum amount of shifting is within the second threshold value, shifted amounts of all the multiple wafers (W) are within the second threshold value.

Substrate transport apparatus 13 of the present embodiment performs the third determination process as above. Even when multiple wafers (W) are held in multiple stages, the apparatus can make an accurate determination as to whether or not wafers (W) are shifted. Thus, substrate transport apparatus 13 exhibits excellent reliability when transporting multiple wafers (W) all at once.

In substrate transport apparatus 13 of the present embodiment, first and second determination processes are conducted prior to the third determination process. The processing load in the first and second determination processes is smaller than that in the third determination process. Thus, shifted amounts of wafers (W) can be detected in a shorter period of time, compared with a process set to be done by performing a third determination process from the beginning.

Substrate Transport Apparatus

Figure 11:
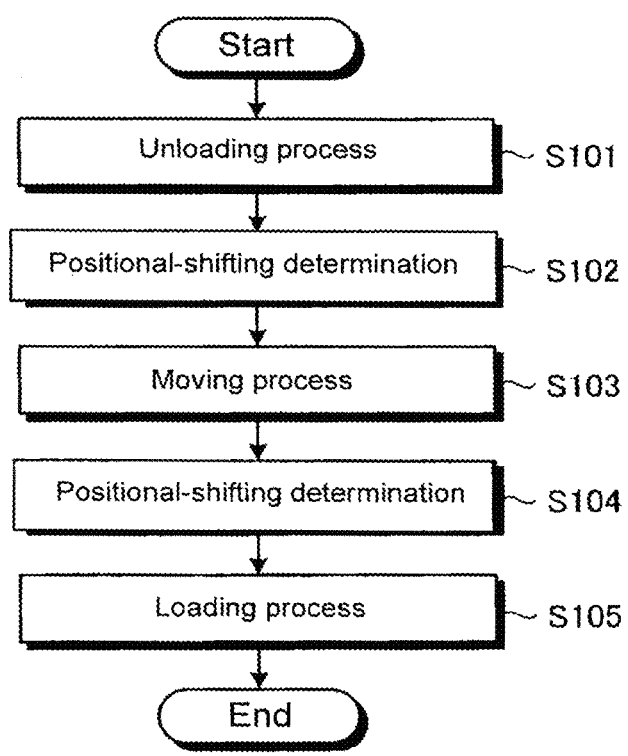
FIG. 11 is a flowchart showing processes of substrate transport procedures.

Specific operations of substrate transport apparatus 13 are described with reference to FIG. 11. FIG. 11 is a flowchart showing the procedures of substrate transport apparatus 13. FIG. 11 shows procedures ranging from unloading wafers (W) from carrier mounting zone 11 to loading the wafers (W) to delivery table 14.

As shown in FIG. 11, control device 18 controls substrate transport apparatus 13 to conduct an unloading process so that wafers (W) are unloaded from carrier (C) placed in carrier mounting zone 11 (process S101). More specifically, control device 18 moves substrate transport apparatus 13 to a position that faces carrier (C), and then advances holding device 102 so that multiple (five, for example) wafers (W) are held at the same time by holding device 102. Then, control device 18 retracts holding device 102 to the home position.

Control device 18 performs the aforementioned positional-shifting determination (process S102), and then moves substrate transport apparatus 13 to a position that faces delivery table 14 (process S103).

After performing positional-shifting determination again (process S104), control device 18 controls substrate transport apparatus 13 so that multiple wafers (W) held in holding device 102 are loaded onto delivery table 14 (process S105).

Positional-shifting determination conducted in processes (S102, S104) is described with reference to FIG. 12.

Figure 12:
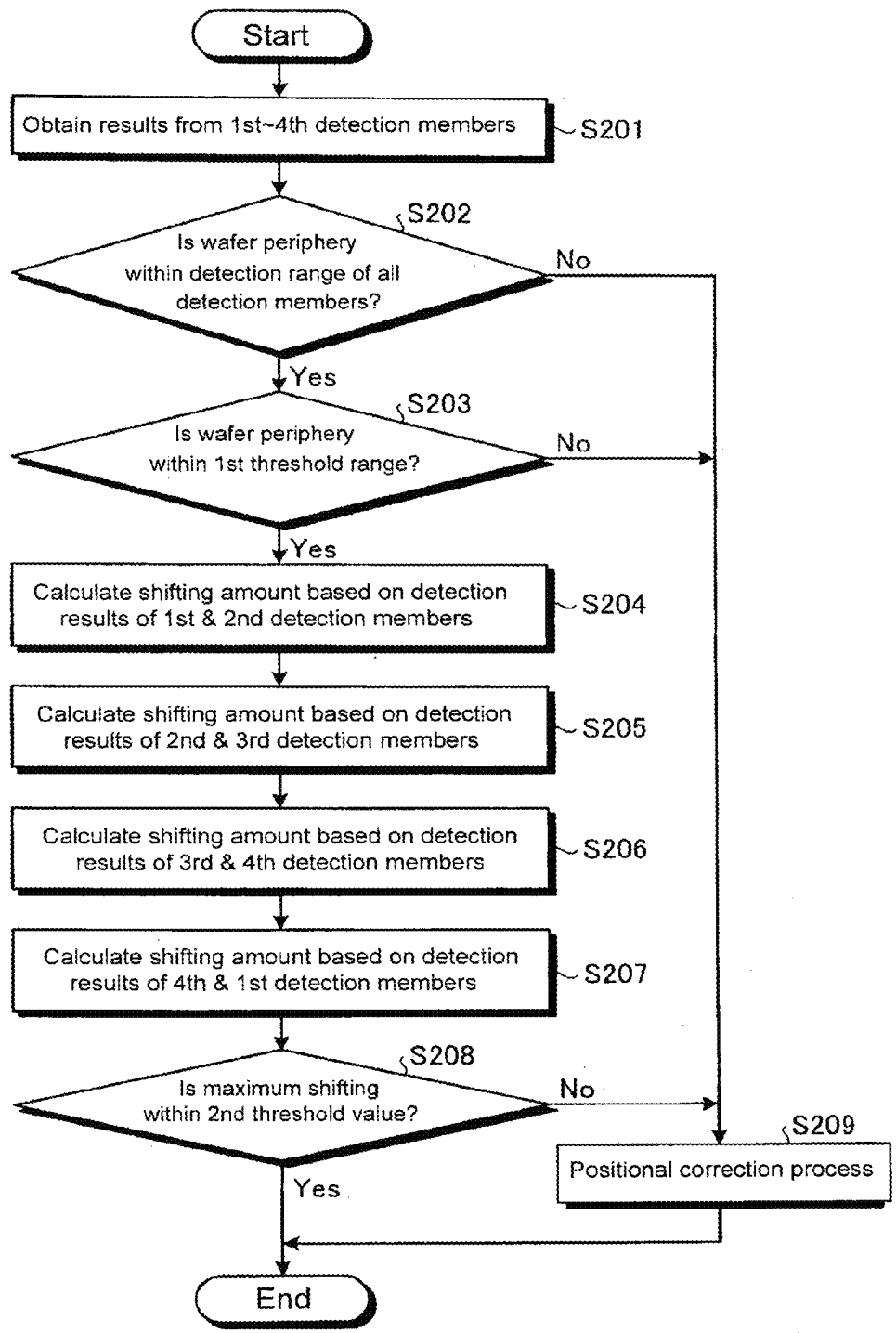
FIG. 12 is a flowchart showing processes of positional-shifting determination.

As shown in FIG. 12, control device 18 obtains the detection results from first through fourth detection components (103a~103d) (process S201). Next, control device 18 performs the first determination process and determines whether or not the periphery of a wafer (W) is positioned within the detection range of all detection components (103a~103d) (process S202).

In process (S202), when peripheries of wafers (W) are positioned within the detection range of all detection components (103a~103d) (Yes, in process S202), control device 18 performs the second determination process and determines whether or not peripheries of wafers (W) detected by detection components (103a~103d) are each positioned within first threshold range (T) (process S203).

In process (S203), control device 18 proceeds to the third determination process when peripheries of wafers (W) detected by detection components (103a~103d) are each positioned within first threshold range (T) (Yes, in process (S203).

More specifically, control device 18 calculates the shifting amount of wafer (Wo') from base position (o) based on the detection results of first and second detection components (103a, 103b) (process S204). Also, control device 18 calculates the amount of shifting of wafer (Wo') from base position (o) based on the detection results of second and third detection components (103b, 103c) (process S205). Furthermore, control device 18 calculates the amount of shifting of wafer (Wo') from base position (o) based on the detection results of third and fourth detection components (103c, 103d) (process S206). Yet furthermore, control device 18 calculates the amount of shifting of wafer (Wo') from base position (o) based on the detection results of fourth and first detection components (103d, 103a) (process S207). Finally, control device 18 determines whether or not the maximum amount of shifting, namely, the maximum value in the shifted amounts calculated in processes (S204~S207), is within the second threshold value (process S208).

In process (S208), when the maximum amount of shifting is determined to be within the second threshold value (Yes, in process S208), control device 18 finishes positional-shifting determination, and proceeds to process (S103 or S105) shown in FIG. 11.

Meanwhile, when the periphery of a wafer (W) is not positioned within the detection range of any of detection components (103a~103d) in process (S202) (No, in process S202), or when the periphery of a wafer (W) detected by any of detection components (103a~103d) is not positioned within the first threshold range (T) in process (S203) (No, in process S203), or when the maximum amount of shifting exceeds the second threshold value in process (S208) (No, in process S208), then control device 18 performs a positional correction process (process S209) before proceeding to process (S103 or S105) shown in FIG. 11.

Positional Correction Process

Figure 13:
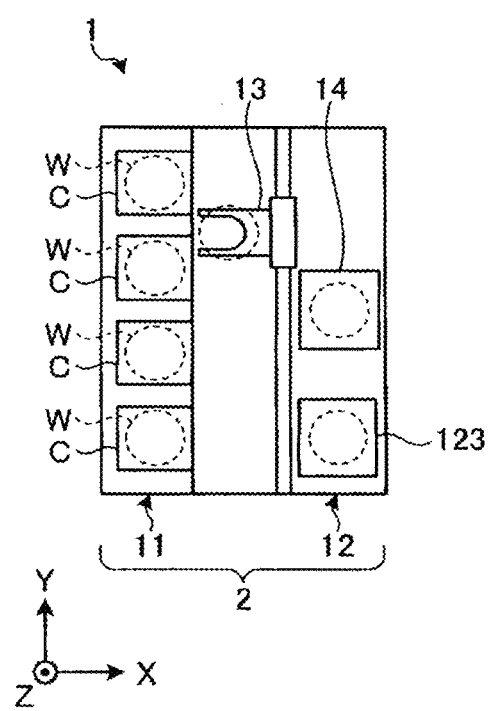
FIG. 13 is a view showing the location of a temporary loading device.

The positional correction process in process (S209) is described with reference to FIG. 13~17. FIG. 13 is a view showing the location of a temporary loading device, and FIG. 14~7 are views illustrating the positional correction process.

As shown in FIG. 13, substrate processing system 1 according to the present embodiment is provided with temporary loading device 123 in transport zone 12 of loading station 2. Temporary loading device 123 is a loading component which is capable of loading multiple wafers (W) held by holding device 102 in multiple stages.

Figure 14:
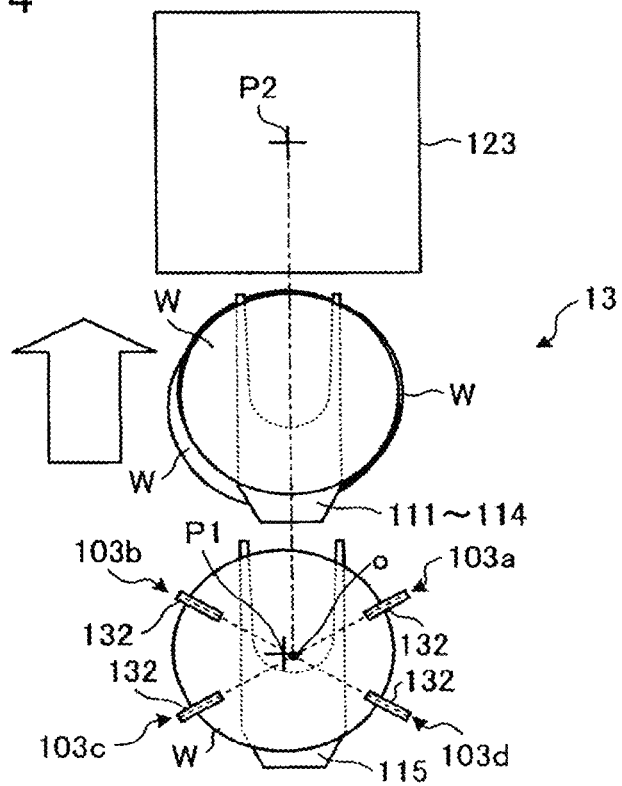
FIG. 14 is a view illustrating a positional correction process.

As shown in FIG. 14, after moving to a position facing temporary loading device 123, substrate transport apparatus 13 advances forks (111~114) among multiple forks (111~115) held by holding device 102 so that wafers (W) held by forks (111~114) are loaded onto temporary loading device 123. Accordingly, only one wafer (W) held in fork 115 remains in substrate transport apparatus 13. Here, it is an option for substrate transport apparatus 13 to load all the wafers (W) onto temporary loading device 123 and to unload a wafer (W) using fork 115.

In FIG. 14, P1 is set as the center position of a wafer (W) held by fork 115, and P2 is set as the center position of a wafer (W), which is not shifted and is placed on temporary loading device 123.

Figure 15:
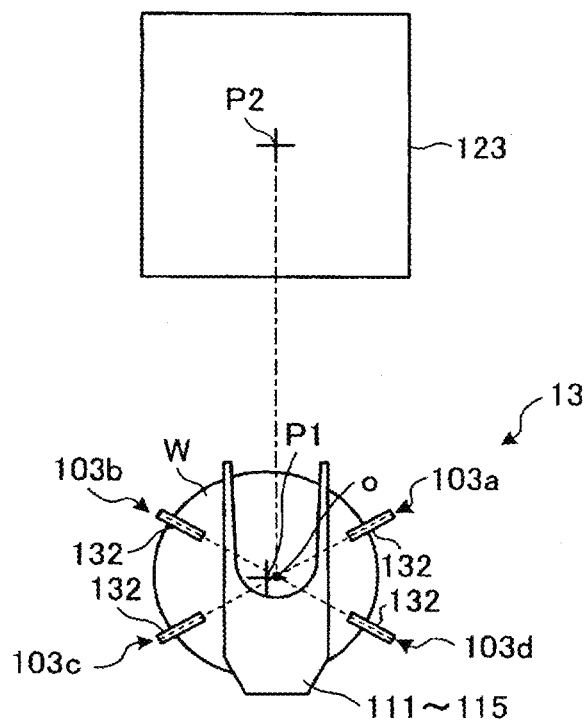
FIG. 15 is a view illustrating the positional correction process.

Next, after retracting forks (111~114) to the home position, substrate transport apparatus 13 controls detection components (103a~103d) to detect the periphery of a wafer (W) held by fork 115, as shown in FIG. 15.

Control device 18 calculates center position (P1) of a wafer (W) held by fork 115 based on the detection results of detection components (103a~103d). For example, control device 18 conducts a calculation on the center position of the wafer (W) each time it obtains detection results from a combination of three detection components among detection components (103a~103d). Namely, control device 18 calculates the center position of the wafer (W) based on the detection results of first, second and third detection components (103a, 103b, 103c), also calculates the center position of the wafer (W) based on the detection results of second, third and fourth detection components (103b, 103c, 103d), calculates the center position of the wafer (W) based on the detection results of third, fourth and first detection components (103c, 103d, 103a), and calculates the center position of the wafer (W) based on the detection results of fourth, first and second detection components (103d, 103a, 103b). After that, control device 18 calculates the average value of the multiple center positions and uses it as the value for center position (P1) of the wafer (W). Then, control device 18 calculates the amount of shifting from base position (o) to center position (P1) of the wafer (W).

Figure 16:
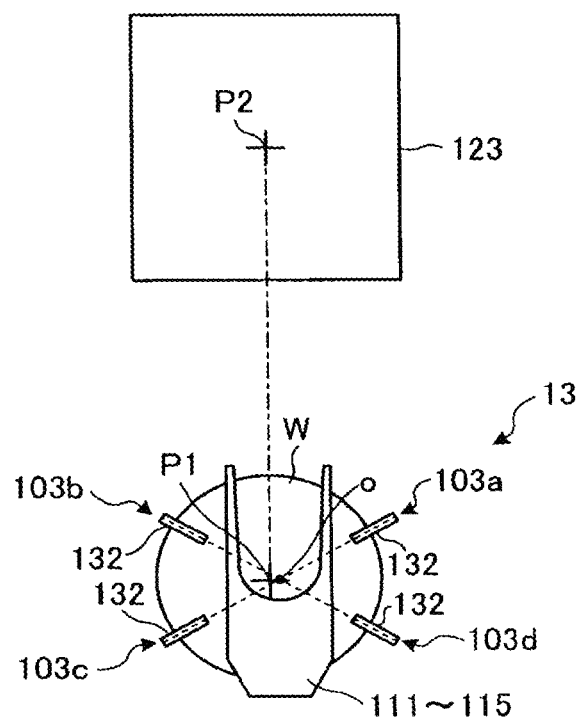
FIG. 16 is a view illustrating the positional correction process.
Figure 17:
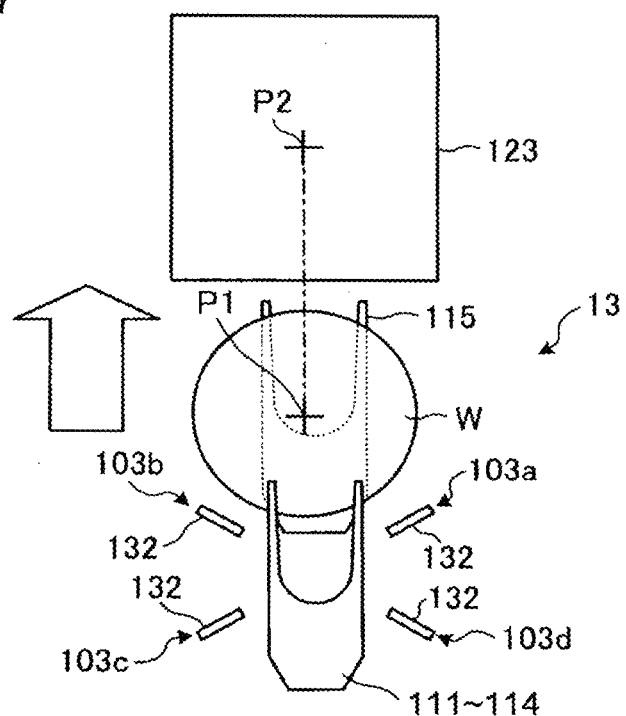
FIG. 17 is a view illustrating the positional correction process.

Next, as shown in FIG. 16, control device 18 modifies the position of holding device 102 based on the calculated amount of shifting so that center position (P1) of the wafer (W) corresponds to base position (o) (namely, base position (o) shown in FIG. 15). Then, as shown in FIG. 17, control device 18 advances fork 115 so that the wafer (W) held by fork 115 is loaded onto temporary loading device 123. Accordingly, positional shifting of the wafer (W) is corrected.

Moreover, control device 18 repeats the following processes on each of remaining wafers (W): control device 18 controls fork 115 to unload a wafer (W) from temporary loading device 123, calculates the amount of shifting of the unloaded wafer (W) from base position (o) based on the detection results of detection components (103a~103d), modifies the position of holding device 102 according to the calculated amount of shifting, and loads back the wafer (W) onto temporary loading device 123. Accordingly, positional shifting of all the wafers (W) is corrected. Then, control device 18 controls holding device 102 to hold all the wafers on temporary loading device 123 so that the wafers are all unloaded from temporary loading device 123, and then proceeds to process (S103 or S105) as shown in FIG. 11.

As described above, substrate transport apparatus 13 of the present embodiment is capable of correcting positional shifting by performing positional correction.

In the above example, positional correction is performed on any wafer (W) when positional shifting is detected. However, whether or not to perform a positional correction process may be determined based on the degree of shifting. For example, when positional shifting is detected in process (S202), a wafer (W) may be shifted significantly. Thus, when the wafer (W) is loaded onto temporary loading device 123 after the positional correction process, fork 115 may bump into a sidewall or the like of temporary loading device 123. For that matter, when positional shifting is detected in process (S202), control device 18 may conduct an abnormality response action by, for example, suspending the substrate transport process and activating an alarm.

When positional shifting is detected in process (S203), it is an option for control device 18 to calculate how much the periphery of a wafer (W) has shifted from the center position of first threshold range (T) as detected by detection components (103a~103d), and to conduct a positional correction process when the amount of calculated shifting is within a predetermined threshold value, or to conduct an abnormality response action when the amount exceeds the predetermined threshold value. In addition, when positional shifting is detected in process (S208), it is also another option for control device 18 to compare the maximum amount of shifting with a predetermined threshold value set to be greater than the second threshold value, and to conduct a positional correction process when the maximum amount of shifting is within the predetermined threshold value, or to conduct an abnormality response action when the amount exceeds the predetermined threshold value.

In the above example, after positional shifting of wafers (W) is corrected, the wafers (W) are unloaded from temporary loading device 123 all at once. However, control device 18 may perform positional correction on a wafer and proceed to process (S103 or 105) one wafer at a time after each correction.

As described so far, substrate transport apparatus 13 of the present embodiment is provided with base 101, holding device 102, at least three detection components (103a~103d), and control device 18. Holding device 102 is set to be retractable relative to base 101 and is capable of holding multiple wafers (W) in multiple stages. Detection components (103a~103d) are set to detect different spots on the peripheries of wafers (W) held by holding device 102. Control device 18 estimates the position of a wafer (W) based on the detection results of detection components (103a~103d), calculates the amount of shifting from predetermined base position (o) to the estimated position of the wafer (W), and executes the transport of the multiple wafers (W) held by holding device 102 when the amount of shifting is determined to be within a second threshold value.

Accordingly, substrate transport apparatus 13 of the present embodiment exhibits excellent reliability when transporting multiple wafers (W) all at once.

In the above embodiment, substrate transport apparatus 13 is described to have four detection components (103a~103d). However, it is sufficient if substrate transport apparatus 13 has at least three detection components.

In the above embodiment, an example of positional-shifting determination included performing a "first determination process," a "second determination process" and a "third determination process." However, substrate transport apparatus 13 does not always have to perform a "first determination process" and a "second determination process."

An example of a substrate transport apparatus for transporting substrates such as semiconductor wafers and glass substrates is provided with a base set to be rotatable around the vertical axis and a fork set to be retractable relative to the base.

Such a substrate transport apparatus may include sensors for determining positional shifting of a substrate held by the fork.

However, when such technologies are applied to a substrate transport apparatus capable of holding multiple substrates in multiple stages, multiple substrates may shift in different directions from each other. Thus, it is difficult to accurately determine whether or not positional shifting has occurred. If accuracy is low when determining positional shifting of a substrate, transport reliability may decrease.

A substrate transport apparatus and a substrate transport method according to embodiments of the present invention transport multiple substrates all at once with high transport reliability.

A substrate transport apparatus according to an embodiment of the present invention is provided with a base, a holding device, at least three detection components, and a control device. The holding device is set to be retractable relative to the base and is capable of holding multiple substrates in multiple stages. The detection components are set to detect different spots on the peripheries of substrates held by the holding device. The control device estimates the position of a substrate based on the detection results of the detection components, calculates the amount of shifting from a predetermined base position to the estimated position of the substrate, and executes the transport of the multiple substrates held by the holding device when the amount of shifting of each substrate is determined to be within a threshold value.

According to an embodiment of the present invention, multiple substrates are transported with high transport reliability.

Obviously, numerous modifications and variations of the present invention are possible in light of the above teachings. It is therefore to be understood that within the scope of the appended claims, the invention may be practiced otherwise than as specifically described herein.

What is claimed is:

1. An apparatus for transporting substrates, comprising:
   a base;
   a holding device configured to retract relative to the base and hold a plurality of substrates in a plurality of stages in a vertical direction, respectively;
   a temporary loading device configured to store the plurality of substrates held by the holding device;
   a detection device comprising three detection components such that the three detection components are positioned to detect peripheries of the substrates from different positions, respectively, while the substrates are being held in the stages in the vertical direction by the holding device; and
   a control device comprising circuitry configured to estimate a position of the substrates held in the stages in the vertical direction based on detection result of the detection device, calculate an amount of shifting in a horizontal direction between a base position and the position of the substrates held in the stages in the vertical direction, determine whether the amount of shifting is within a threshold value, and execute transport of the substrates held by the holding device when the amount of shifting is determined to be within the threshold value,
   wherein the circuitry of the control device is configured to control the holding device such that when the amount of shifting exceeds the threshold value, the holding device holds one of the substrates and the temporary loading device stores the other substrates and that the detecting device detects the periphery of the one of the substrates held by the holding device, calculate an amount of shifting of the one of the substrates from the base position based on detection result of the detecting device, and control the holding device such that the holding device changes a position based on the amount of shift to match a position of the one of the substrates with the base position.

2. An apparatus for transporting substrates according to claim 1, wherein the circuitry of the control device is configured to estimate a first center position of the substrates for the position of the substrates based on detection result of two adjacent detection components of the detection device, calculate an amount of shifting in the horizontal direction between a center position set as the base position and the first center position of the substrates, estimate a second center position of the substrates for the position of the substrates based on detection result of different two adjacent detection components of the detection device, calculate an amount of shifting in the horizontal direction between the center position set as the base position and the second center position of the substrates by the different two adjacent detection components, and determine whether the amounts of shifting are within the threshold value.

3. An apparatus for transporting substrates according to claim 1, wherein the circuitry of the control device is configured to control the holding device such that after changing the position based on the calculated amount of shift to match the position of the one of the substrate with the base position, the holding device stores the one of the substrates in the temporary loading device and takes another one of the substrates from the temporary loading device, calculate an amount of shifting of the other one of the substrates from the base position based on detection result of the detecting device control the holding device such that the holding device changes a position based on the amount of shift to match a position of the other one of the substrates with the base position, and control the holding device such that the holding device holds the substrates stored in the temporary loading device after matching positions of all of the substrates with the base position through repetitions.

4. An apparatus for transporting substrates according to claim 1, wherein the circuitry of the control device is configured to determine whether the amount of shifting is within the threshold value after determining a position of the peripheries of the substrates is within detection ranges of the detection components.

5. An apparatus for transporting substrates according to claim 1, wherein the circuitry of the control device is configured to determine whether the amount of shifting is within the threshold value after determining a position of the peripheries of the substrates is within detection ranges of the detection components and determining the position of the peripheries of the substrates is within a predetermined range in the detection ranges of the detection components.

6. An apparatus for transporting substrates according to claim 1, wherein each of the detection components comprises a linear image sensor.

7. An apparatus for transporting substrates according to claim 6, wherein the linear image sensor comprises a plurality of light receiving elements and is positioned such that the plurality of light receiving elements is arrayed on an imaginary straight line extending through the base position.

8. An apparatus for transporting substrates according to claim 6, wherein the linear image sensor of each of the detection components is positioned on the base.

9. A substrate processing system, comprising:
   a substrate transport apparatus comprising a base, a holding device configured to retract relative to the base and hold a plurality of substrates in a plurality of stages in a vertical direction, respectively, a temporary loading device configured to store the plurality of substrates held by the holding device, a detection device comprising three detection components such that the three detection components are positioned to detect peripheries of the substrates from different positions, respectively, while the substrates are being held in the stages in the vertical direction by the holding device; and
   a control device comprising circuitry configured to estimate a position of the substrates held in the stages in the vertical direction based on detection result of the detection device, calculate an amount of shifting in a horizontal direction between a base position and the position of the substrates held in the stages in the vertical direction, determine whether the amount of shifting is within a threshold value, and execute transport of the substrates held by the holding device when the amount of shifting is determined to be within the threshold value
   wherein the circuitry of the control device is configured to control the holding device such that when the amount of shifting exceeds the threshold value, the holding device holds one of the substrates and the temporary loading device stores the other substrates and that the detecting device detects the periphery of the one of the substrates held by the holding device, calculate an amount of shifting of the one of the substrates from the base position based on detection result of the detecting device, and control the holding device such that the holding device changes a position based on the amount of shift to match a position of the one of the substrates with the base position.

10. A method for transporting substrates, comprising:
holding a plurality of substrates such that a holding device configured to retract relative to the base holds the plurality of substrates in a plurality of stages in a vertical direction, respectively;
detecting peripheries of the substrates held by the holding device such that a detection device comprising three detection components detects the peripheries of the substrates from different positions, respectively, while the substrates are being held in the stages in the vertical direction by the holding device;
estimating a position of the substrates held in the stages in the vertical direction based on detection result of the detection device;
calculating an amount of shifting in a horizontal direction between a base position and the position of the substrates held in the stages in the vertical direction;
determining whether the amount of shifting is within a threshold value; and
executing transport of the substrates held by the holding device when the amount of shifting is determined to be within the threshold value,
wherein when the amount of shifting exceeds the threshold value, the holding device holds one of the substrates and a temporary loading device configured to store the plurality of substrates held by the holding device stores the other substrates, the detecting device detects the periphery of the one of the substrates held by the holding device, an amount of shifting of the one of the substrates from the base position is calculated based on detection result of the detecting device, and the holding device changes a position based on the amount of shift to match a position of the one of the substrates with the base position.

11. A method for transporting substrates according to claim 10, wherein the estimating of the positions of the substrates comprises estimating a first center position of the substrates for the position of the substrates based on detection result of two adjacent detection components of the detection device, and estimating a second center position of the substrates for the position of the substrates based on detection result of different two adjacent detection components of the detection device, the calculating of the amount of shifting comprises calculating amounts of shifting in the horizontal direction between a center position set as the base position and the first center position of the substrates, and calculating an amount of shifting in the horizontal direction between the center position set as the base position and the second center position of the substrates by the different two adjacent detection components, and the determining comprises determining whether the amounts of shifting are within the threshold value.

12. A substrate processing system according to claim 9, wherein the circuitry of the control device is configured to estimate a first center position of the substrates for the position of the substrates based on detection result of two adjacent detection components of the detection device, calculate an amount of shifting in the horizontal direction between a center position set as the base position and the first center position of the substrates, estimate a second center position of the substrates for the position of the substrates based on detection result of different two adjacent detection components of the detection device, calculate an amount of shifting in the horizontal direction between the center position set as the base position and the second center position of the substrates by the different two adjacent detection components, and determine whether the amounts of shifting are within the threshold value.

13. A substrate processing system according to claim 9, wherein the circuitry of the control device is configured to control the holding device such that after changing the position based on the calculated amount of shift to match the position of the one of the substrate with the base position, the holding device stores the one of the substrates in the temporary loading device and takes another one of the substrates from the temporary loading device, calculate an amount of shifting of the other one of the substrates from the base position based on detection result of the detecting device, control the holding device such that the holding device changes a position based on the amount of shift to match a position of the other one of the substrates with the base position, and control the holding device such that the holding device holds the substrates stored in the temporary loading device after matching positions of all of the substrates with the base position through repetitions.

14. A substrate processing system according to claim 9, wherein the circuitry of the control device is configured to determine whether the amount of shifting is within the threshold value after determining a position of the peripheries of the substrates is within detection ranges of the detection components.

15. A substrate processing system according to claim 9, wherein the circuitry of the control device is configured to determine whether the amount of shifting is within the threshold value after determining a position of the peripheries of the substrates is within detection ranges of the detection components and determining the position of the peripheries of the substrates is within a predetermined range in the detection ranges of the detection components.

16. A substrate processing system according to claim 9, wherein each of the detection components comprises a linear image sensor.

17. A substrate processing system according to claim 16, wherein the linear image sensor comprises a plurality of light receiving elements and is positioned such that the plurality of light receiving elements is arrayed on an imaginary straight line extending through the base position.

18. A substrate processing system according to claim 16, wherein the linear image sensor of each of the detection components is positioned on the base.

19. A method for transporting substrates according to claim 10, wherein after changing the position based on the calculated amount of shift to match the position of the one of the substrate with the base position, the holding device stores the one of the substrates in the temporary loading device and takes another one of the substrates from the temporary loading device, an amount of shifting of the other one of the substrates from the base position is calculated based on detection result of the detecting device, the holding device changes a position based on the amount of shift to match a position of the other one of the substrates with the base position, and the holding device holds the substrates stored in the temporary loading device after matching positions of all of the substrates with the base position through repetitions.

20. A method for transporting substrates according to claim 10, further comprising:

determining whether the amount of shifting is within the threshold value after determining a position of the peripheries of the substrates is within detection ranges of the detection components.

* * * * *